United States Patent [19]

Ambruoso, Sr.

[11] 3,929,023

[45] Dec. 30, 1975

[54] TUNING SCREW LOCK AND TORQUE CONTROL

[75] Inventor: Pasquale Ambruoso, Sr., Coral Springs, Fla.

[73] Assignee: Motorola, Inc., Chicago, Ill.

[22] Filed: Sept. 27, 1974

[21] Appl. No.: 509,988

[52] U.S. Cl. ........ 74/10.85

[51] Int. Cl.[2] ........ F16H 35/18

[58] Field of Search ........ 74/10.85, 459

[56] References Cited

UNITED STATES PATENTS

| | | | |
|---|---|---|---|
| 2,578,608 | 12/1951 | Shull | 74/424.8 R |
| 2,591,644 | 4/1952 | Wadsworth | 74/10.85 UX |
| 3,084,313 | 4/1963 | Crooks | 74/10.85 X |
| 3,177,730 | 4/1965 | Sanger et al. | 74/10.85 |
| 3,267,764 | 8/1966 | Berman | 74/459 X |

FOREIGN PATENTS OR APPLICATIONS

| | | | |
|---|---|---|---|
| 347,187 | 4/1937 | Italy | 74/10.85 |

*Primary Examiner*—Leonard H. Gerin

*Attorney, Agent, or Firm*—James W. Gillman; Victor Myer

[57] ABSTRACT

A molded resilient plastic insert with slotted flange combining with an appropriately shaped aperture to provide proper torque and locking action, along with insertion guidance, for a tuning screw of a type used in electronic equipment.

6 Claims, 3 Drawing Figures

TUNING SCREW LOCK AND TORQUE CONTROL

BACKGROUND OF THE INVENTION

The present invention relates to fastening devices and in particular to a tuning screw lock and torque control for radios.

One of the main problems encountered in the use of preset tuning devices for communications equipment has been to combine ease of tuning with prevention of undesired detuning. This problem becomes acute when physical dimensions are necessarily very small. Life expectancy of a locking device is typically reduced proportionately in the latter case. Also, many partial solutions to these problems have had the disadvantage of being easily separated from the apparatus and lost to use.

Other problems are providing automatic centering and prohibiting eccentric rotation of the tuning screw which could adversely effect the tuning operation. In addition, any device to solve the aforementioned problems should also be easy to install and remove, while at the same time not requiring removal during the tuning operation. Also desirable is a device with such improvements which can be produced inexpensively.

These problems exist in tuning devices whether the tuning screw is required to be insulated from its mounting or is to have good electrical contact therewith.

SUMMARY

Accordingly, it is a general object of this invention to provide a new and improved fastening device for tuning screws of electronic equipment.

It is a more specific object of the invention to provide improved locking capability along with easier tuning capability.

It is another specific object of the invention to provide an improved, longer lasting screw locking device of a very small size.

It is yet another specific object of the invention to provide a firm support for the tuning screw, with positive and consistent electrical contact between the tuning screw and its supporting structure when this is desirable and with insulation between when desired.

It is another and particular object of the invention to provide automatic centering and eliminate eccentric rotation of the screw.

It is yet another particular object of the invention to provide such a locking device which is inexpensive as well as easy to install or remove as desired though not necessitating removal during a tuning operation.

In a preferred embodiment of this invention a resilient plastic insert is releasably retained in an aperture in a housing wall of a tuning device. This insert has a flange and a slot extending through the flange and into the body of the insert. In use, a tuning screw is put through the insert and the wall. The portion of the screw which extends beyond the housing wall and into a tuning cavity has an effect on the electrical characteristics of that cavity. When the tuning device is used, the exact position of the screw is critical and must be maintained exactly until retuning is desired.

The aperture in the housing wall is so constructed as to retain the plastic insert firmly yet allow for insertion and removal as desired. The walls of the aperture also contribute to the production of torque and locking action. As the tuning screw is turned in the plastic insert, the insert is prevented from advancing along with the screw by the shape of the aperture. Thus, an axial force is produced which increases the friction between the threads of the tuning screw and the mating threads of the housing wall. Additional locking capability is provided by the portions of the aperture which abut the parallel edges of the insert flange portion. These aperture portions prevent rotation of the flange portion of the insert as the body portion of the insert tends to follow the motion of the screw threads. The resulting controlled deformation of the material of the insert provides further locking capability. The deformation is intensified by the slot which extends through the flange and into the body of the insert. This slot also provides relief from excessive strain on the resilient material, thus keeping the torque on the screw within requirements. The plastic insert further prevents eccentric insertion of the tuning screw into the threaded portion of the housing wall.

In brief, the invention is a tuning screw lock and torque control made up of an aperture in a housing wall, a tuning screw, and a molded resilient plastic insert, the insert being contained within and retained by the walls of the aperture. The aperture has a cavity for preventing axial motion of the insert, a slot for preventing rotation of the insert and shoulders for retaining the insert. The insert has a body portion which mates with the threads of the tuning screw and provides torque on the screw. It also has flanges which are integral with the body portion for preventing axial motion of the insert and for providing locking action on the screw. There is a slot extending through the flange and through a substantial portion of the body portion which relieves excess stress on the material of the insert, contributes to the locking action on the screw and contributes to the torque applied to the screw.

DETAILED DESCRIPTION

Figure 1:
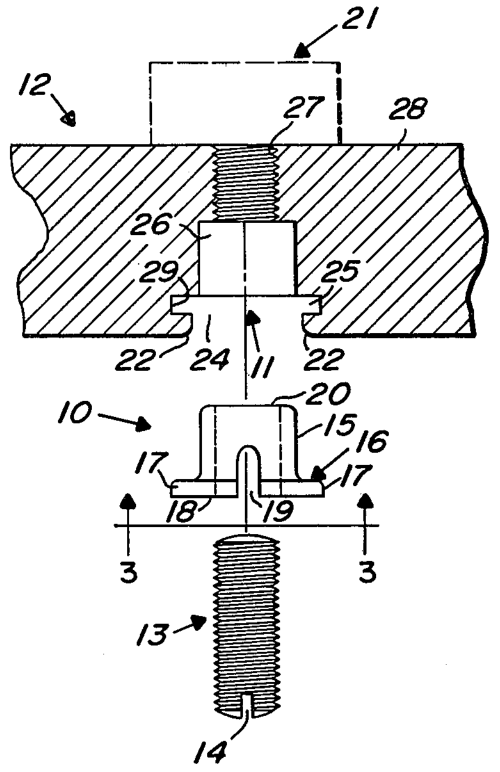
FIG. 1 is an exploded sectional view of an embodiment of the invention.
Figure 2:
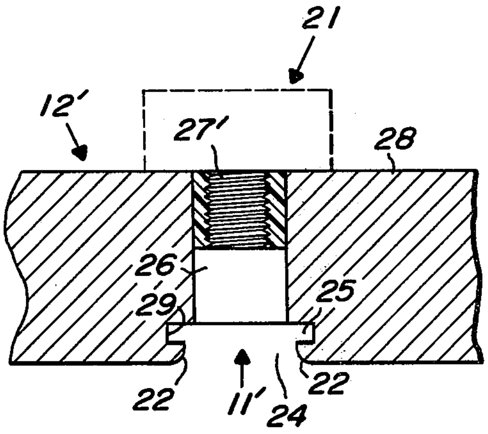
FIG. 2 is a sectional view of the aperture of a second embodiment.
Figure 3:
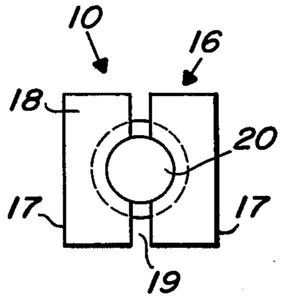
FIG. 3 is an elevational view taken along the lines 3—3 in FIG. 1.

Referring now to FIGS. 1–3 of the drawing, there is shown a lock and torque control device for tuning screws of the type used in preset tuning devices in communications equipment.

In such applications it is desired that the tuning screw be easily turned when so desired and it is essential that the position of the screw remain fixed until retuning is desired. The two embodiments shown in the drawing provide these characteristics as well as others which will be shown hereinafter.

As shown, the device consists of a single molded resilient plastic insert 10 in combination with an aperture 11 in the housing wall 12 of the equipment (not shown) and a tuning screw 13.

The tuning screw 13 can be caused to rotate by any suitable means as by inserting a screwdriver in a slot 14 in one end of the screw. Rotation of the tuning screw produces longitudinal motion thereof and in particular produces motion of the other end of the screw within a tuning cavity 21 (shown dotted), of which the screw 13 is a complementary part. The diameter and thread of the tuning screw 13 are a function of the dimensions of said tuning cavity. The length of the tuning screw is appreciably greater than the length of screw required for tuning purposes added to the total length of the aperture 11.

The plastic insert 10 is molded of a resilient and durable material for good abrasion resistance and for ability to exert the desired torque on the screw 13, a preferred choice being, specifically, elastomeric material polyurethane in the 90–95 shore A durometer hardness. The insert 10 includes a body portion 15 which is cylindrical in these embodiments, and a flange means 16 on one end of the body portion 15 which extends perpendicularly from the body portion. The perimeter of flange means 16 is square in this embodiment, however other shapes are feasible. It is preferred that the perimeter of flange means 16 have two substantial portions 17 which are approximately parallel. In any case, the portions 17 should mate closely with the abutting surfaces 29 of the aperture 11. The flange means 16 has sufficient thickness to resist deformation out of the plane of the end surface 18. The transverse dimension of the body portion 15 is substantially greater than the outside diameter of the screw 13. Across the diameter of the end surface 18 is a slot 19 which extends through the flange means 16 and also through approximately one half the longitudinal dimension of the body portion 15. The slot 19 is parallel with one pair of approximately parallel perimeter portions 17 of the flange means 16.

The aperture 11 has a through bore comprising four axially aligned sections; an opening portion 24 which lies between a pair of parallel, spaced apart, shoulders 22 of the housing wall 12, a slot 25 adapted to receive the flange means 16 of the insert 10, a cavity 26 adapted to receive the insert body portion 15, and a cylindrical threaded portion 27. The opening portion 24 has a longitudinal dimension (into the paper of FIG. 1) substantially greater than the length of the slot 19 of the insert 10 and a transverse dimension which will allow insertion and removal while preventing undesired dislocation of the insert 10. The slot 25 has a longitudinal dimension (into the paper of FIG. 1) substantially greater than the length of the slot 19 of the insert 10 and a transverse dimension no less than and approximately the same as the width of the flange means 16, said width being measured perpendicularly to the slot 19 in the insert 10. The cavity 26 of the aperture 11 has approximately the same dimensions as the body portion 15 of the insert 10. The cylindrical threaded portion 27 of aperture 11 mates with the tuning screw 13 and extends from the cavity 26 to the back surface 28 of the housing wall 12. With the exception of the threads of the aperture portion 27, the aperture 11 is provided at essentially no extra cost when the housing wall 12 and the entire housing (not shown) are diecast.

The insert 10 is positioned in the aperture 11 with the slot 19 parallel to the shoulders 22 and the perimeter portions 17 engaged in the slot 25 under the shoulders 22. The exact dimensions of the slot 19 are chosen to relieve excessive stress in the plastic material of the insert and to produce a desired constant torque on the screw 13. The combination of the aforementioned torque with the axial force on the material of the insert in the direction of the longitudinal motion of the screw and caused by said motion, and with the locking action provided by the parallel portions 17 of the flange means 16 in contact with the adjacent surfaces 29 of the aperture 11 provides the required amount of control torque to maintain the tuning screw 13 in precise position and alignment relative to the housing wall 12 with positive and consistent contact with the housing wall. The through bore 20 extending longitudinally through the center of the insert is of a diameter appropriately smaller than the outside thread dimension of the tuning screw 13. The exact diameter of the bore 20 is determined by the size of the tuning screw and by the torque requirement. The slot 19 in the insert 10 is also important in facilitating insertion and removal of the insert when such action is desired. Undesired dislocation of the insert is prevented by the shoulders 22 of the housing wall.

FIG. 2 illustrates another embodiment wherein like parts are designated with like numbers having a prime added to indicate the different embodiment.

In an embodiment not requiring electrical contact between the tuning screw 13 and the housing wall 12' such as disclosed in FIG. 2, the cylindrical portion 27' of the aperture 11' would be formed of a nonconducting material suitably harder than the material of the insert 10. The other parts are unchanged and thus are not shown.

In a typical embodiment of this device, the housing wall 12 forms a part of a tuning cavity 21 (shown dotted) of a communications radio (not shown). The tuning screw 13 forms a part of the tuning cavity and is rotated by the operator of the radio to advance and withdraw the portion of the screw 13 which extends beyond the housing wall 12 into the tuning cavity. It is of the utmost importance that a setting of the tuning screw 13 remain unchanged until retuning is desired.

In a typical application of this invention the tuning screw 13 would be a number 2–56 steel screw. The major dimensions of the plastic insert are: the flange width, 0.18 inches; the total height of the insert, 0.115 inches; the diameter of the through bore, approximately 0.08 inches; the depth of the slot, 0.075 inches; the width of the slot, 0.03 inches at its widest point; the outside diameter of the body portion, 0.14 inches; and the thickness of the flange, 0.03 inches. While these dimensions are completely practical and do not diminish the capabilities of the device it is not to be construed that any loss of novelty of the instant invention or benefit to the art would ensue if said dimensions were changed appreciably.

I claim:

1. A tuning screw lock and torque control comprising:

a. a housing wall defining an aperture;

b. a tuning screw having predetermined characteristics; and c. a molded resilient plastic insert, said insert being contained within and retained by the walls of said aperture;

said aperture, having cavity means for preventing axial motion of said insert, slotted means for preventing rotation of said insert, and shoulder means for retaining said insert; and said insert having a body portion for threadedly mating with said tuning screw and for providing frictional resistance to said screw, flange means integral with said body portion for preventing axial motion of said insert and for providing locking action on said screw, and a slotted means extending through said flange means and through a substantial portion of said body portion for relieving excess stress on the material of said insert and for contributing to the locking action on said screw, and for contributing to the frictional resistance applied to said screw.

2. A tuning screw lock and torque control comprising:

a. a housing wall defining an aperture;

b. a tuning screw having predetermined characteristics; and c. a molded resilient plastic insert, said insert being contained within and retained by said aperture;

said aperture having cavity means for preventing axial motion of said insert, slotted means for preventing rotation of said insert, and shoulder means for retaining said insert; and said insert having a body portion for threadedly mating with said tuning screw and for providing frictional resistance to said screw, flange means integral with said body portion for preventing axial motion of said insert and for providing locking action on said screw, with the perimeter of said flange means having two considerable portions which are substantially parallel and which abut two surfaces of the slotted means of said aperture, and a slotted means extending through said flange means and through a substantial portion of said body portion for relieving excess stress on the material of said insert and for contributing to the locking action on the said screw and for contributing to the frictional resistance applied to said screw.

3. A tuning screw lock and torque control according to claim 2 wherein said insert is molded of an elastomer.

4. A tuning screw lock and torque control according to claim 3 wherein said elastomer is elastomeric material polyurethane in the 90–95 shore A durometer hardness.

5. A tuning screw lock and torque control according to claim 4 wherein said threaded means of said aperture is an integral portion of a metal housing wall providing positive and consistent electrical contact between said tuning screw and said housing wall.

6. A tuning screw lock and torque control according to claim 4 wherein said threaded means of said aperture is made of a material harder than that of said insert and having insulating properties.

* * * * *